US007791945B2

(12) United States Patent
Shin et al.

(10) Patent No.: US 7,791,945 B2
(45) Date of Patent: Sep. 7, 2010

(54) SEMICONDUCTOR MEMORY DEVICE INCLUDING APPARATUS FOR DETECTING THRESHOLD VOLTAGE

(75) Inventors: Yoon-Jae Shin, Kyoungki-do (KR); Jun-Gi Choi, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 292 days.

(21) Appl. No.: 12/003,675

(22) Filed: Dec. 31, 2007

(65) Prior Publication Data

US 2008/0304335 A1 Dec. 11, 2008

(30) Foreign Application Priority Data

Jun. 8, 2007 (KR) ..................... 10-2007-0055935

(51) Int. Cl.
*G11C 11/34* (2006.01)

(52) U.S. Cl. ........................... 365/185.21; 365/185.22; 365/185.24; 365/189.07; 365/189.09

(58) Field of Classification Search ............ 365/185.21, 365/185.22, 185.24, 189.09, 189.07
See application file for complete search history.

(56) References Cited

U.S. PATENT DOCUMENTS 5,263,031 A 11/1993 Inoue
5,687,180 A 11/1997 Kawasaki
5,874,851 A * 2/1999 Shiota ........................ 327/537
5,880,622 A * 3/1999 Evertt et al. ................. 327/535
6,597,603 B2 7/2003 Lambrache et al.
7,002,846 B2 * 2/2006 Okimoto et al. ........ 365/185.19
7,061,305 B2 6/2006 Kim
2006/0273844 A1 12/2006 Lee

FOREIGN PATENT DOCUMENTS

JP 09-106698 4/1997
JP 2005-071582 3/2005

OTHER PUBLICATIONS

Korean Office Action, with English translation, issued in Korean Patent Application No. KR 10-2007-0055935, mailed May 29, 2008.
Tschanz, J., et al., "Adaptive Body Bias for Reducing Impacts of Die-to-Die and Within-Die Parameter Variations on Microprocessor Frequency and Leakage", IEEE Journal of Solid-State Circuits, Nov. 2002, pp. 1396-1402, vol. 37 No. 11, IEEE.

* cited by examiner

*Primary Examiner*—Son Dinh
(74) *Attorney, Agent, or Firm*—IP & T Law Firm PLC

(57) ABSTRACT

A semiconductor device including a threshold voltage detector and a boosted voltage generating unit. The threshold voltage detector detects a threshold voltage level of cell transistors and outputs a detected threshold voltage level. The boosted voltage generating unit changes a target level of a boosted voltage in response to the detected threshold voltage level. The threshold voltage detector includes a detected current generating unit and a detected voltage generating unit. The detected current generating unit has a plurality of cell transistors in a cell array and generates a detected current whose amplitude varies corresponding to an average level of the threshold voltages of the cell transistors. The detected voltage generating unit generates the detected threshold voltage level whose level is determined corresponding to the amplitude of the detected current.

20 Claims, 3 Drawing Sheets

SEMICONDUCTOR MEMORY DEVICE INCLUDING APPARATUS FOR DETECTING THRESHOLD VOLTAGE

CROSS-REFERENCE TO RELATED APPLICATION

The present application claims priority to Korean patent application number 10-2007-0055935, filed on Jun. 8, 2007, which is incorporated by reference in its entirety.

BACKGROUND OF THE INVENTION

The present subject matter relates to semiconductor design technology; and, particularly, to a detection circuit for detecting a threshold voltage of a semiconductor device and an internal voltage generating circuit using the same, and more particularly, to a circuit for generating a boosted voltage by changing a target level depending on the level of a threshold voltage of the semiconductor device.

Generally, a dynamic RAM (hereinafter, referred to as "DRAM") uses one capacitor and one MOS transistor as a unit storage device for recording data, which is called a cell.

When data of '1' or logic 'high level' is stored in the cell, a high potential, generally, a core voltage VCORE is applied to the capacitor, and when a data of '0' or logic 'low level is stored in the cell, a low potential, generally, a ground voltage VSS is applied to the capacitor.

At this time, a MOS transistor included in each cell operates as a switch. When a voltage higher than a predetermined level is applied to a word line, the MOS transistor is turned on to connect the capacitor and a bit line. In other words, charge is shared between the capacitor and the bit line so that the electric potential applied to the capacitor is renewed.

Likewise, when a voltage lower than a predetermined level is applied to the word line, the MOS transistor is turned off not to connect the capacitor and the bit line. In other words, charge is not shared between the capacitor and the bit line, so that the capacitor maintains the electric potential renewed upon charge sharing.

FIG. 1 is a detailed circuit diagram showing a cell configuration of a conventional semiconductor device.

Referring to FIG. 1, a cell of the general semiconductor device includes an NMOS transistor TCN and a capacitor CS.

Concretely, in the NMOS transistor TCN, a gate and a word line are connected, a drain and the capacitor CS are connected, and a source and a bit line are connected. In its operation, when the word line connected to the gate is activated and a boosted voltage VPP is applied to the word line, the NMOS transistor TCN controls the connection of the bit line and the capacitor CS, which are connected to the drain and source, respectively, in response to the boosted voltage VPP.

As described above, a high potential, generally, a core voltage VCORE, and a low potential, generally, a ground voltage VSS, are charged in the capacitor CS, and a bit line precharge voltage VBLP is applied to the bit line. Further, the level of the bit line precharge voltage VBLP is generally equal to a half the level of the core voltage VCORE.

Therefore, when the bit line and the capacitor CS are connected by the NMOS transistor TCN, if the voltage charged in the capacitor CS is the core voltage VCORE, charge is transferred from the capacitor CS to the bit line and if the voltage charged in the capacitor CS is the ground voltage VSS, charge is transferred from the bit line to the capacitor CS.

In this way, the NMOS transistor TCN operates as a switch between the bit line and the capacitor CS, controls such that charge flows between the bit line and the capacitor CS when a boosted voltage VPP is applied to the word line connected to the gate, and controls such that no charge flows between the bit line and the capacitor CS when no boosted voltage VPP is applied to the word line.

By the way, in order that the NMOS transistor TCN operates as a switch to transfer charge between the bit line and the capacitor CS without any loss, a predetermined level of the boosted voltage VPP to be applied to the word line should satisfy the following condition.

That is, a predetermined level of the boosted voltage VPP must be a value obtained by adding a level of a threshold voltage $V_{TH}$ which is a minimum voltage required to control such that charge flows between the drain and source of the NMOS transistor TCN, a level of a core voltage VCORE, which is a maximum voltage that can be transferred between the bit line and the capacitor CS, and a given voltage a, which is a voltage that is added in order to transfer charge between the bit line and the capacitor CS without any loss even when a level of the boosted voltage VPP sharply drops by the operation of the semiconductor device.

This can be expressed as:

$$VPP=VCORE+V_{TH}+a \quad \text{Eq. (1)}$$

Meanwhile, most semiconductor devices including the aforementioned DRAM use a method of supplying by itself voltages required for the operation of in-chip circuits by being provided with, in a chip, an internal voltage generating circuit for generating an internal voltage of various electric potentials using a power supply voltage VDD supplied from the outside and a ground voltage VSS.

In other words, the aforementioned boosted voltage VPP is also generated through a boosted voltage generating circuit within a semiconductor device.

FIG. 2 is a block diagram showing a conventional boosted voltage generating circuit for a semiconductor device.

Referring to FIG. 2, the conventional boosted voltage generating circuit 10 for a semiconductor device includes a boosted voltage detector 100 for detecting a level of a boosted voltage VPP and a boosted voltage output unit 120 for outputting a boosted voltage VPP by controlling the execution of a charge pumping operation in response to an output signal DET_VPP of the boosted voltage detector 100.

The boosted voltage output unit 120 is provided with an oscillator 122 for outputting an oscillation signal OSC toggling in a predetermined cycle in response to the output signal DET_VPP of the boosted voltage detector 100 and a pumping unit 124 for rising a level of the boosted voltage VPP by performing a charge pumping operation in response to the oscillation signal OSC.

Based on the above-described construction, the operation of the conventional boosted voltage VPP generating circuit 10 for a semiconductor device will be described below in detail.

First, the boosted voltage detector 100 compares a level of the boosted voltage VPP with a target reference voltage VREFP to determine a level of the output signal DET_VPP depending on the comparison result.

For instance, when a level of the boosted voltage VPP feedbacked from the boosted voltage output unit 120 is higher than a level of the target reference voltage VREFP, a level of the output signal DET_VPP is transited to logic high and outputted.

Similarly, when a level of the boosted voltage VPP feedbacked from the boosted voltage output unit 120 is lower than a level of the target reference voltage VREFP, a level of the output signal DET_VPP is shifted to logic low and outputted.

Here, the reference voltage VREFP is generally a voltage which is generated from a band gap circuit of a semiconductor device, and always maintains a stable voltage level regardless of PVT (process, voltage, and temperature) variations of the semiconductor device.

Among the components of the boosted voltage output unit 120, the oscillator 122 outputs the oscillation signal OSC toggling in a predetermined cycle in response to the level of the output signal DET_VPP of the boosted voltage detector 100.

Further, among the components of the boosted voltage output unit 120, the pumping unit 124 generates the boosted voltage VPP by performing a charge pumping operation in response to the toggling of the oscillation signal OSC.

For example, if the level of the output signal DET_VPP of the boosted voltage detector 100 is logic 'low', the oscillation signal OSC outputted from the oscillator 122 among the components of the boosted voltage output unit 120 does not oscillate in a predetermined cycle but fixed to logic 'low' or logic 'high'.

Therefore, the pumping unit 124 among the components of the boosted voltage output unit 120 does not perform the charge pumping operation, and thus, the level of the boosted voltage VPP drops due to natural discharge or use in the semiconductor device.

Likewise, if the level of the output signal DET_VPP of the boosted voltage detector 100 is logic 'high', the oscillation signal OSC outputted from the oscillator 122 among the components of the boosted voltage output unit 120 oscillates in a predetermined cycle.

Thus, the pumping unit 124 among the components of the boosted voltage output unit 120 performs the charge pumping operation, and accordingly, the level of the boosted voltage VPP rises.

FIG. 3 is a detailed circuit diagram showing the boosted voltage detector among the components of the conventional boosted voltage generating circuit for a semiconductor device shown in FIG. 2.

Referring to FIG. 3, among the components of the conventional boosted voltage generating circuit 10 for a semiconductor device, the boosted voltage detector 100 includes a voltage divider 102 for dividing a boosted voltage VPP at a predetermined ratio to generate a divided voltage DIV_VPP and a voltage comparator 104 for comparing levels of a reference voltage VREFP corresponding to a target level of the boosted voltage VPP and the divided voltage DIV_VPP to output a boosted voltage detection signal DET_VPP, the level of which is determined based on the comparison result.

More specifically, the voltage divider 102 is provided with first and second fixed resistors R1 and R2 connected in series between a boosted voltage VPP end and a ground voltage VSS end and having a predetermined resistance, and outputs the divided voltage DIV_VPP at a connection node of the first fixed resistor R1 and the second fixed resistor R2.

Further, the voltage comparator 104 is provided with a unit amplifier 1042 for changing the level of a voltage applied to an output node OUTN corresponding to a level difference between the divided voltage DIV_VPP and the reference voltage VREFP corresponding to the target level of the boosted voltage VPP and a driver 1044 for driving the boosted voltage detection signal DET_VPP in response to the level of the voltage applied to the output node OUTN.

The unit amplifier 1042 is a current mirror type unit amplifier, and is composed of a first NMOS transistor N1 whose gate receives the divided voltage DIV_VPP, a second NMOS transistor N2 whose gate receives the reference voltage VREFP corresponding to the target level of the boosted voltage VPP, a third NMOS transistor N3 whose gate takes a bias voltage Vbias and for controlling the connection of a common node COMM of the drain and source and the ground voltage VSS end in response to the bias voltage Vbias, a first PMOS transistor P1 operating as a diode as the gate and the drain are connected between the power supply voltage VDD end and an intermediate node ZN connected to the drain of the first NMOS transistor N1, and a second PMOS transistor P2 whose gate takes the voltage applied to the intermediate node ZN and for controlling the level of a voltage to be applied to the output node OUTN by controlling the connection of the power supply voltage VDD end and the output node OUTN in response to the voltage applied to the gate.

The driver 1044 is provided with an inverter INV for driving the boosted voltage detection signal DET_VPP in response to the level of the voltage applied to the output node OUTN.

On the basis of the above-described configuration, the operation of the boosted voltage detector 100 among the components of the conventional boosted voltage VPP generating circuit 10 for the semiconductor device will be described below in detail.

For reference, the voltage divider 102 divides the boosted voltage VPP at a predetermined ratio through the first and second fixed resistors R1 and R2. Generally, the first and second fixed resistors R1 and R2 control the level of the divided voltage DIV_VPP to be equal to a half the level of the boosted voltage VPP by having the same resistance.

However, the first and second fixed resistors R1 and R2 do not need to have the same resistance, but may have different resistances. That is, it is possible to change their resistances upon design thereof.

Moreover, it is also possible to divide the boosted voltage VPP by adjusting the predetermined ratio thereof by using more resistors than the first and second fixed resistors R1 and R2, for example, three or four resistors.

First, when the level of the boosted voltage VPP is sufficiently higher than a predetermined level, i.e., the level of the divided voltage DIV_VPP is higher than the level of the reference voltage VREFP corresponding to a target level of the boosted voltage VPP, if the semiconductor device enables a word line by using the boosted voltage VPP, the level of the boosted voltage VPP starts to drop. In other words, the level of the divided voltage DIV_VPP starts to drop.

As the level of the divided voltage DIV_VPP drops like this, it becomes lower than the level of the reference voltage VREFP corresponding to the target level of the boosted voltage VPP at a certain instant.

Thus, the amount of current flowing in the output node OUTN and the common node COMM that are connected to the drain and source of the second NMOS transistor N2 receiving the reference voltage VREFP via the gate is greater than the amount of current flowing in the intermediate node ZN and the common node COMM connected to the drain and source of the first NMOS transistor N1 taking the divided voltage DIV_VPP via the gate.

Due to this, the level of a voltage applied to the output node OUTN drops more than the level of a voltage applied to the intermediate node ZN does. The voltage applied to the intermediate node ZN that drops less as above is inputted to the gate of the second PMOS transistor P2 to decrease the amount of current flowing between the power supply voltage VDD end and the output node OUTN that are connected to the source and drain, thereby much further decreasing the level of the voltage applied to the output node OUTN.

Like this, if the level of the voltage applied to the output node OUTN decreases and thus drops lower than the threshold voltage level of the inverter INV provided in the driver 1044, the boosted voltage detection signal DET_VPP driven by the inverter INV provided in the driver 1044 becomes logic 'high', wherein the threshold voltage level is a level at which the inverter INV is able to distinguish logic 'high' and logic 'low' of the inverter INV provided at the driver 1044, for example, a signal inputted at 0.5 V or less is recognized as logic 'low' to make an output signal fall to logic 'high', while a signal inputted at 1.2 V or more is recognized as logic 'high' to make an output signal fall to logic 'low'.

Next, when the level of the boosted voltage VPP is sufficiently lower than a predetermined level, i.e., the level of the divided voltage DIV_VPP is lower than the level of the reference voltage VREFP corresponding to a target level of the boosted voltage VPP, if the pumping unit 124 among the components of the boosted voltage output unit 120 performs a charge pumping operation, the level of the boosted voltage VPP starts to rise. In other words, the level of the divided voltage DIV_VPP starts to rise.

As the level of the divided voltage DIV_VPP rises, it becomes higher than the level of the reference voltage VREFP corresponding to the target level of the boosted voltage VPP at a certain instant.

Accordingly, the amount of current flowing in the output node OUTN and the common node COMM that are connected to the drain and source of the second NMOS transistor N2 receiving the reference voltage VREFP via the gate is smaller than the amount of current flowing in the intermediate node ZN and the common node COMM that are connected to the drain and source of the first NMOS transistor N1 receiving the divided voltage DIV_VPP via the gate.

Due to this, the level of the voltage applied to the intermediate node ZN drops more than the level of a voltage applied to the output node OUTN does. The voltage applied to the intermediate node ZN that drops more as above is inputted to the gate of the second PMOS transistor P2 to increase the amount of current flowing between the power supply voltage VDD end and the output node OUTN that are connected to the source and drain, thereby allowing a larger amount of current than the amount of current flowing from the output node OUTN to the common node COMM to flow from the power supply voltage VDD end to the output node OUTN by the second NMOS transistor N2.

Like this, if the level of the voltage applied to the output node OUTN increases and thus rises higher than the threshold voltage level of the inverter INV provided in the driver 1044, the boosted voltage detection signal DET_VPP driven by the inverter INV provided in the driver 1044 becomes logic 'low'.

As described above, the boosted voltage detector 100 performs the operation of varying the logic level of the output signal DET_VPP so that the boosted voltage VPP can always maintain a predetermined level on the basis of the level of the reference voltage VREFP generated by a band gap circuit corresponding to a target level of the boosted voltage VPP.

At this time, the predetermined level of the boosted voltage VPP is determined by a predetermined level of the core voltage VCORE, a threshold voltage $V_{TH}$ of the NMOS transistor TCN used in a cell array, and the given voltage a, as seen in FIG. 3 and Eq. (1).

For instance, if the predetermined level of the core voltage VCORE is 1.8 V, the threshold voltage of the NMOS transistor TCN is 0.7 V and the given voltage a is 0.9 V, the predetermined level of the boosted voltage VPP becomes 3.4 V, which is obtained by adding all the values.

Further, once the predetermined level of the boosted voltage VPP is determined, a predetermined level of the divided voltage DIV_VPP generated by dividing the boosted voltage VPP at a predetermined ratio is determined as well. If the predetermined ratio is 1/2, the predetermined level of the divided voltage DIV_VPP is 1.7 V, and if it is 1/3, the predetermined level thereof is 1.13 V.

Since the predetermined ratio for generating the divided voltage DIV_VPP is determined by using a fixed resistor having a predetermined resistance, the fixed resistor has to be replaced by redesigning in order to vary the predetermined ratio. That is, it is difficult to vary the predetermined ratio.

Further, the level of the reference voltage VREFP used for comparison of the divided voltage DIV_VPP in the boosted voltage detector 100 is equal to a predetermined level of the divided voltage DIV_VPP. It is apparent that while the level of the divided voltage DIV_VPP varies according to variations of the level of the boosted voltage VPP, the level of the reference voltage VREFP is always constant regardless of level variations of the boosted voltage VPP and PVT variations.

Thus, in order to vary the level of the reference voltage VREFP that is determined once, it is necessary to adjust the size of various devices, such as MOS transistors, resistors, capacitors, etc., in the band gap circuit by redesigning. That is, it is difficult to vary the level of the reference voltage VREFP.

By the way, when producing a cell array of a semiconductor device through an actual process, it is possible to vary the threshold voltage $V_{TH}$ of the NMOS transistor TCN used in the cell array for each wafer.

For example, although a predicted threshold voltage is designed to be 0.7 V, the threshold voltage $V_{TH}$ may vary between 0.5 V and 0.9 V in products produced by an actual process.

However, at the time of design, the level of the threshold voltage $V_{TH}$ is designed to be constantly fixed, and thus, variations of the level of the threshold voltage $V_{TH}$ by a process cannot be reflected in design.

For example, the boosted voltage generating circuit 10 is unable to recognize a variation of the level of the threshold voltage $V_{TH}$ between 0.5 V and 0.9 V, and operates such that a predetermined level of the boosted voltage VPP is always 3.4 V.

When a predetermined level of the boosted voltage VPP is fixed regardless of the variation of the level of the threshold voltage $V_{TH}$ used in a cell array, if the level of the threshold voltage $V_{TH}$ is lower than a predetermined level, a boosted voltage VPP that is too higher than a required level is supplied to the cell array, so that unnecessary current is consumed.

Further, if the level of the threshold voltage $V_{TH}$ is higher than a predetermined level, a boosted voltage VPP that is too lower than a required level is supplied to the cell array, so that the operation of the semiconductor device becomes unstable.

Moreover, in the prior art, in order to vary the levels of the boosted voltage VPP, the divided voltage DIV_VPP and the reference voltage VREFP corresponding to variations of the threshold voltage $V_{TH}$, redesigning has to be made as described above. Thus, it is impossible to apply variations of the level of the threshold voltage $V_{TH}$ to design.

SUMMARY OF THE INVENTION

Embodiments of the present subject matter are directed to providing an apparatus for generating an internal voltage generator in response to a threshold voltage of a semiconductor memory device.

In accordance with an aspect of the present subject matter, there is provided a semiconductor device including a threshold voltage detector and a boosted voltage generating unit.

The threshold voltage detector detects a threshold voltage level of cell transistors and outputs a detected threshold voltage level. The boosted voltage generating unit changes a target level of a boosted voltage in response to the detected threshold voltage level. The threshold voltage detector includes a detected current generating unit and a detected voltage generating unit. The detected current generating unit has a plurality of cell transistors in a cell array and for generating a detected current whose amplitude varies corresponding to an average level of the threshold voltages of the cell transistors. The detected voltage generating unit generates the detected threshold voltage level whose level is determined corresponding to the amplitude of the detected current.

In accordance with another aspect of the present subject matter, there is provided a driving method of a semiconductor device including detecting a threshold voltage level of cell transistors to output a detected threshold voltage level; and changing a target level of a boosted voltage level in response to the detected threshold voltage level. The step of detecting the threshold voltage level includes changing an amplitude of a detected current flowing in a detection node corresponding to an amplitude of the threshold voltage of each of the plurality of cell transistors in a cell array and outputting the detected threshold voltage level determined corresponding to the amplitude of the detected current.

In accordance with further aspect of the present subject matter, there is provided a semiconductor device including a test cell array for having cell transistors and a boosted voltage generating unit for changing a target level of a boosted voltage according to a threshold voltage level of the cell transistors.

DETAILED DESCRIPTION

Hereinafter, preferred embodiments of the present subject matter will be described in detail with reference to the accompanying drawings. But, the present subject matter is not limited to the embodiments set forth below but may be implemented in various types, and these embodiments are provided only for full disclosure of the subject matter and for those skilled in the art to completely know the scope of the present subject matter.

Figure 1:
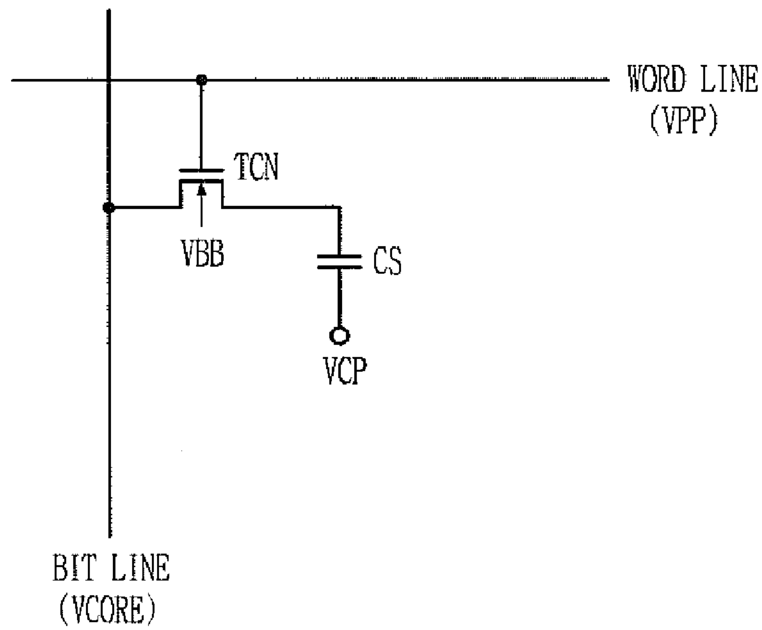
FIG. 1 is a detailed circuit diagram showing a cell configuration of a general semiconductor device.
Figure 2:
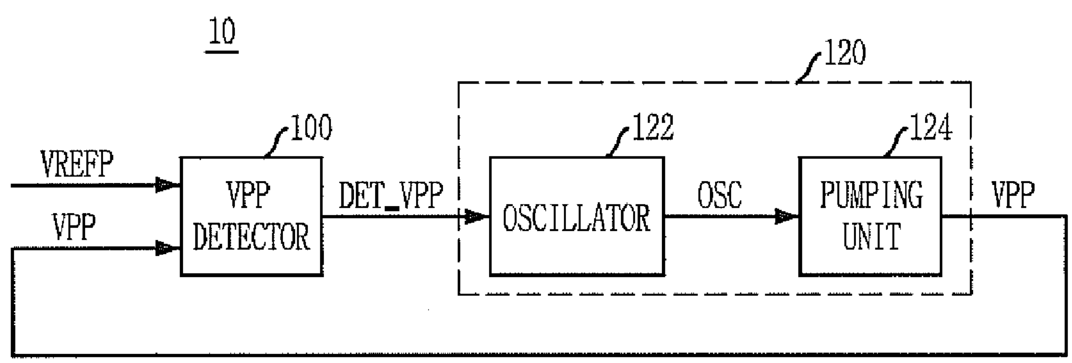
FIG. 2 is a block diagram showing a conventional boosted voltage generating circuit for a semiconductor device.
Figure 3:
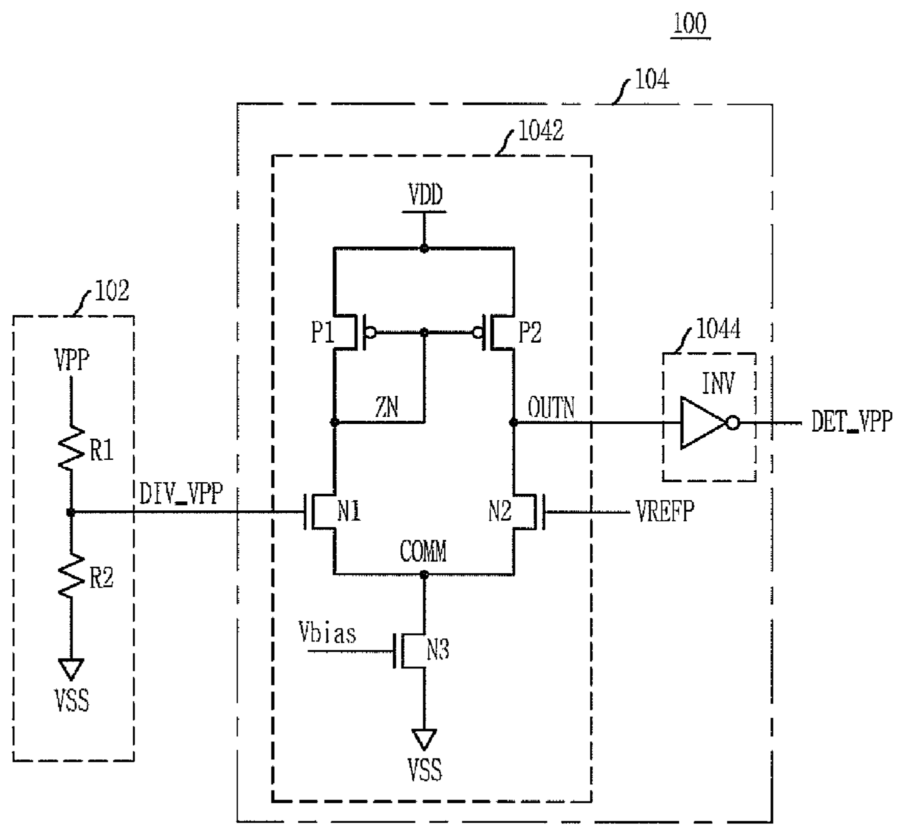
FIG. 3 is a detailed circuit diagram showing the boosted voltage detector among the components of the conventional boosted voltage generating circuit for a semiconductor device depicted in FIG. 2.
Figure 4:
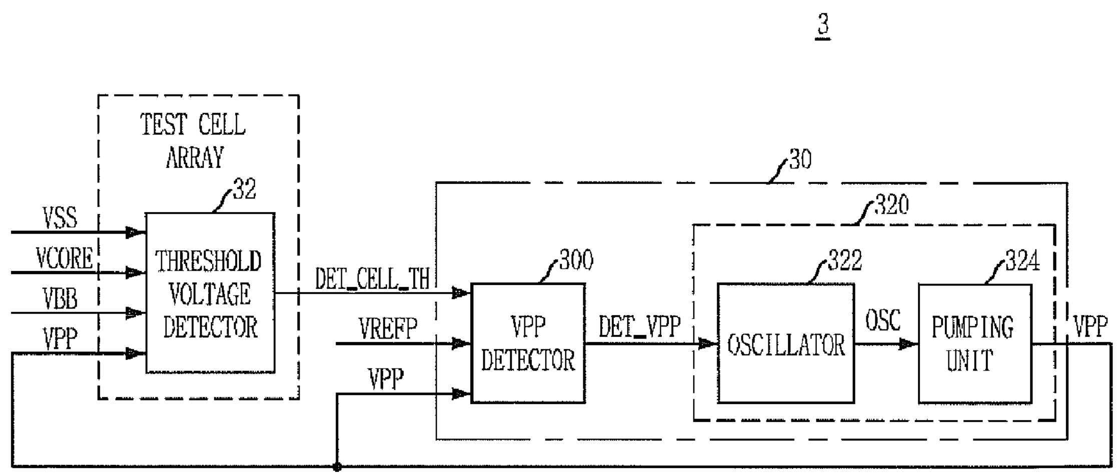
FIG. 4 is a block diagram showing a boosted voltage generating circuit of a semiconductor device having a threshold voltage detector in accordance with an embodiment of the present subject matter.

FIG. 4 is a block diagram showing a boosted voltage generating circuit of a semiconductor device having a threshold voltage detector in accordance with an embodiment of the present subject matter.

Referring to FIG. 4, the boosted voltage VPP generating circuit 3 of a semiconductor device having another threshold voltage detector 32 in accordance with the embodiment of the present subject matter includes a threshold voltage detector 32 for detecting a threshold voltage $V_{TH}$ of cell transistors provided in a cell array and generating a detected voltage DET_CELL_TH whose level is determined based on the result of detection, and a boosted voltage generator 30 for producing a boosted voltage VPP whose target level is changed in response to the detected voltage DET_CELL_TH.

The boosted voltage generating unit 30 is provided with a boosted voltage detector 300 for detecting a boosted voltage by changing the target level in response to the level of the detected voltage DET_CELL_TH, and a boosted voltage output unit 320 for outputting the boosted voltage VPP corresponding to the target level by controlling the execution of a charge pumping operation in response to an output signal DET_VPP of the boosted voltage detector 300.

Further, among the components of the boosted voltage generating unit 30, the boosted voltage output unit 320 is provided with an oscillator 322 for outputting an oscillation signal OSC toggling in a predetermined cycle in response to the output signal DET_VPP of the boosted voltage detector 300 and a pumping unit 324 for rising a level of the boosted voltage VPP by performing a charge pumping operation in response to the oscillation signal OSC.

Figure 5:
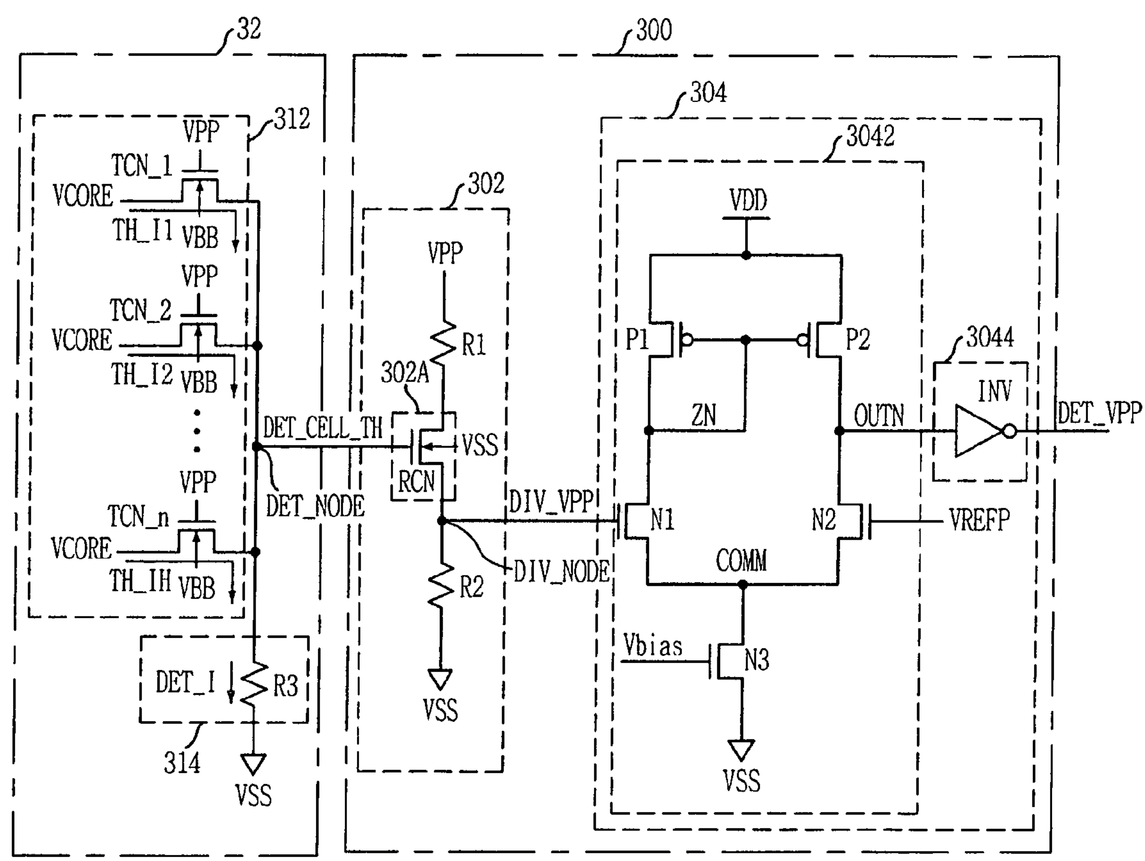
FIG. 5 is a detailed circuit diagram showing the threshold voltage detector and the boosted voltage detector among the components of the boosted voltage generating circuit of a semiconductor device having the threshold voltage detector in accordance with the embodiment of the present subject matter depicted in FIG. 4.

FIG. 5 is a detailed circuit diagram showing the threshold voltage detector and the boosted voltage detector among the components of the boosted voltage generating circuit for a semiconductor device having the threshold voltage detector in accordance with the embodiment of the present subject matter depicted in FIG. 4.

Referring to FIG. 5, among the components of the boosted voltage generating circuit 3 for the semiconductor device having the threshold voltage detector 32, the threshold voltage detector 32 includes a detected current generating unit 312 having a plurality of cell transistors TCN_1, TCN_2, . . . , TCN_n in a cell array and for generating a detected current DET_I whose amplitude varies corresponding to the average level of the threshold voltages $V_{TH}$ of the cell transistors TCN_1, TCN_2, . . . , TCN_n and a detected voltage generating unit 314 for generating a detected voltage DET_CELL_TH whose level is determined corresponding to the amplitude of the detected current DET_I.

To be more specific, the detected current generating unit 312 controls such that the detected current DET_I flows in a detection node DET_NODE connected to the sources by applying a boosted voltage VPP to the gates of the plurality of cell transistors TCN_1, TCN_2, . . . , TCN_n prepared therein, applying a back bias voltage VBB to the biases, and applying a core voltage VCORE to the drains.

The detected voltage generating unit 314 is provided with a fixed resistor R3 which is serially connected between the detection node DET_NODE and a ground voltage VSS end and has a predetermined resistance for generating the detected voltage DET_CELL_TH in response to the detected current DET_I.

Among the components of the boosted voltage generating circuit 3 for a semiconductor device having the threshold voltage detector 32 in accordance with the embodiment of the present subject matter, the boosted voltage detector 300 includes a voltage divider 302 for dividing the boosted voltage VPP at a predetermined ratio, at which the value is determined in response to a level of the detected voltage DET_CELL_TH, to generate a divided voltage DIV_VPP, and a voltage comparator 304 for comparing levels of the divided voltage DIV_VPP and the reference voltage VREFP and outputting a boosted voltage detection signal DET_VPP whose logic level is determined depending on the result of comparison.

More specifically, the voltage divider 302 is provided with a first fixed resistor R1 having a predetermined resistance connected in series between the boosted voltage VPP end and a division node DIV_NODE, a variable resistor 302A having a resistance varying according to a level of the detected voltage DET_CELL_TH, and a second fixed resistor R2 having a predetermined resistance connected in series between the division node DIV_NODE and the ground voltage VSS end. The divided voltage DIV_VPP is generated at the division node DIV_NODE.

Further, the voltage comparator 304 is provided with a unit amplifier 3042 for changing the level of a voltage applied to the output node OUTN corresponding to a level difference between the divided voltage DIV_VPP and the reference voltage VREFP corresponding to the target level of the boosted voltage VPP and a driver 3044 for driving the boosted voltage detection signal DET_VPP corresponding to the level of a voltage applied to the output node OUTN.

The unit amplifier 3042 is a current mirror type unit amplifier, and is provided with a first NMOS transistor N1 whose gate receives the divided voltage DIV_VPP, a second NMOS transistor N2 whose gate takes the reference voltage VREFP corresponding to the target level of the boosted voltage VPP, a third NMOS transistor N3 whose gate receives a bias voltage Vbias and for controlling the connection of a common node COMM of the drain and source and the ground voltage VSS end in response to the bias voltage Vbias, a first PMOS transistor P1 operating as a diode as the gate and the drain are connected between the power supply voltage VDD end and an intermediate node ZN to which the drain of the first NMOS transistor N1 is connected, and a second PMOS transistor P2 whose gate takes a voltage applied to the intermediate node ZN and for controlling the level of a voltage applied to the output node OUTN by controlling, in response to the voltage, the connection of the power supply voltage VDD end and the output node OUTN that are connected to the source and drain.

The driver 3044 is provided with an inverter INV for driving the boosted voltage detection signal DET_VPP in response to the level of the voltage applied to the output node OUTN.

On the basis of the above-described configuration, the operation of the threshold voltage detector 32 and the boosted voltage detector 300 among the components of the boosted voltage generating circuit 3 for a semiconductor device having the threshold voltage detector 32 in accordance with the embodiment of the present subject matter will be described in detail below.

First, in the detected current generating unit 312 among the components of the threshold voltage detector 32, the boosted voltage VPP is applied to the gates of a plurality of cell transistors TCN_1, TCN_2, . . . , TCN_n, whose sources are forcibly connected to the detection node DET_NODE, by using the plurality of cell transistors TCN_1, . . . , TCN_2, . . . , TCN_n provided in a test cell array area that is not used in a normal operation, a back bias voltage VBB is applied to the biases, and a core voltage VCORE is applied to the drains. Due to this, currents TH_I1, TH_I2, . . . , TH_In corresponding to the threshold voltage $V_{TH}$ of each of the plurality of cell transistors TCN_1, TCN_2, . . . , TCN_n are generated between the drain and source of each of the cell transistors TCN_1, TCN_2, . . . , TCN_n. As the source of each of the cell transistors TCN_1, TCN_2, . . . , TCN_n is commonly connected to the detection node DET_NODE, a detected current DET_I, obtained by adding all of the currents TH_I1, TH_I2, . . . , TH_In corresponding to the threshold voltage $V_{TH}$ of each of the cell transistors TCN_1, TCN_2, . . . , TCN_n by Kirchhoff's current law KCL flows in the detection node DET_NODE.

The amplitudes of the currents TH_I1, TH_I2, . . . , TH_In corresponding to the threshold voltage $V_{TH}$ of each of the cell transistors TCN_1, TCN_2, . . . , TCN_n may be different from each other depending on processes.

Among the components of the threshold voltage detector 32, the detected voltage generating unit 314 generates a detected voltage DET_CELL_TH through the detection node DET_NODE by connecting the fixed resistor R3 having a predetermined resistance between the detection node DET_NODE, in which the detected current DET_I flows by the detected current generating unit 312, and the ground voltage VSS end.

Further, among the components of the boosted voltage detector 300, the voltage divider 302 divides the boosted voltage VPP by using the first fixed resistor R1, the variable resistor 302A, and the second fixed resistor R2. On the basis of the division node DIV_NODE at which the divided voltage DIV_VPP is generated, the first fixed resistor R1 and the variable resistor 302A are connected to the boosted voltage VPP end, and the second fixed resistor R2 is connected to the ground voltage VSS end.

In other words, the level of the divided voltage DIV_VPP is determined by the ratio of the resistance of the second fixed resistor R2 to an added resistance of the first fixed resistor R1 and the variable resistor 302A on the basis of the division node DIV_NODE.

For example, if the ratio of the resistance of the second fixed resistor R2 to an added resistance of the first fixed resistor R1 and the variable resistor 302A is 1:1, the level of the divided voltage DIV_VPP is equal to a half the level of the boosted voltage VPP.

At this time, the resistance of the variable resistor 302A changes in response to the level of the detected voltage DET_CELL_TH outputted from the threshold voltage detector 32.

That is, if the resistance of the variable resistor 302a is varied by a variation of the level of the detected voltage DET_CELL_TH, the ratio of the resistance of the second fixed resistor R2 to an added resistance of the first fixed resistor R1 and the variable resistor 302A is varied to thus vary the level of the divided voltage DIV_VPP.

For example, it is assumed that the ratio of the resistance of the second fixed resistor R2 to an added resistance of the first fixed resistor R1 and the variable resistor 302A before the variation of the level of the detected voltage DET_CELL_TH is 1:1.

Under the assumption, if the average level of the threshold voltages $V_{TH}$ of each of the plurality of cell transistors TCN_1, TCN_2, . . . , TCN_n provided in the detected current generating unit 312 among the components of the threshold voltage detector 32 decreases lower than a predetermined level, the amplitude of the detected current DET_I and the level of the detected voltage DET_CELL_TH increase.

Therefore, the resistance of the variable resistor 302A decreases, the ratio of the resistance of the second fixed resistor R2 to an added resistance of the first fixed resistor R1 and the variable resistor 302A changes to 1:1.1, and the level of the divided voltage DIV_VPP is varied to a level higher than a half the level of the boosted voltage VPP.

Due to this, although the level of the reference voltage VREFP continues to be unchanged, the target level of the boosted voltage VPP decreases lower than a predetermined level, thereby compensating for a decrease in the average level of the threshold voltages $V_{TH}$ that is lower than a predetermined level.

Likewise, if the average level of the threshold voltages $V_{TH}$ of the plurality of cell transistors TCN_1, TCN_2, . . . , TCN_n provided in the detected current generating unit 312 among the components of the threshold voltage detector 32 increases lower than a predetermined level, the amplitude of the detected current DET_I and the level of the detected voltage DET_CELL_TH decreases.

Thus, the resistance of the variable resistor 302A increases, the ratio of the resistance of the second fixed resistor R2 to an added resistance of the first fixed resistor R1 and the variable resistor 302A changes to 1.1:1, and the level of the divided voltage DIV_VPP is varied to a level lower than a half the level of the boosted voltage VPP.

Due to this, although the level of the reference voltage VREFP continues to be unchanged, the target level of the boosted voltage VPP increases higher than a predetermined level, thereby compensating for an increase in the average level of the threshold voltages $V_{TH}$ that is higher than a predetermined level.

Further, the configuration and operation of the voltage comparator 302 among the components of the boosted voltage detector 300 are the same as those of the voltage comparator 102 among the components of the conventional boosted voltage detector 100 as shown in FIG. 4, and its operation has been described in detail in the BACKGROUND section, so they will be omitted here.

By applying the embodiment of the present subject matter as described above, even in case of the level of wafers mass-produced through an actual process, it is possible to detect threshold voltage levels of cell transistors used in a cell array of a semiconductor device, and also to generate a boosted voltage VPP whose target level changes based on the result of detection.

Accordingly, in response to a variation of the level of the threshold voltage $V_{TH}$ used in the cell array, a predetermined level of the boosted voltage VPP can be varied.

Due to this, it is possible to prevent a boosted voltage VPP that is much higher than a required level from being supplied to the cell array if the level of the threshold voltage $V_{TH}$ is lower than a predetermined level, which has been the problem of the prior art, thereby preventing consumption of unnecessary current.

Likewise, it is possible to prevent a boosted voltage VPP that is much lower than a required level from being supplied to the cell array if the level of the threshold voltage $V_{TH}$ is higher than a predetermined level, which has been the problem of the prior art, thereby preventing unstabilization of the operation of the semiconductor device.

Moreover, the predetermined level of the boosted voltage VPP can be varied in response to the variation of the level of the threshold voltage $V_{TH}$ used in the cell array without any change in design, thereby reducing development time.

Although the above embodiment has been described with respect to a case where the target level of a boosted voltage VPP among a plurality of internal voltages used in a semiconductor device is changed depending on the level of a threshold voltage, the present subject matter also includes a case where the target level of a plurality of other internal voltages used in the semiconductor device except for the boosted voltage VPP is changed depending on the level of the threshold voltage.

Further, it should be noted that the logic gates and transistors used in the above embodiment may be implemented in different locations and types based on the polarity of the input signals.

As described above, in according with the present subject matter, even in case of the level of wafers mass-produced through an actual process, it is possible to detect threshold voltage levels of cell transistors used in a cell array of a semiconductor device, and also to generate an internal voltage whose target level changes depending on the result of detection.

While the present subject matter has been described with respect to the specific embodiments, it will be apparent to those skilled in the art that various changes and modifications may be made without departing from the spirit and scope of the subject matter as defined in the following claims.

What is claimed is:

1. A semiconductor device, comprising:

a threshold voltage detector for detecting a threshold voltage level of cell transistors and outputting a detected threshold voltage level; and a boosted voltage generating unit for changing a target level of a boosted voltage in response to the detected threshold voltage level, wherein the threshold voltage detector includes:

a detected current generating unit having the cell transistors in a cell array and for generating a detected current whose amplitude varies corresponding to an average level of the threshold voltages of the cell transistors; and a detected voltage generating unit for generating the detected threshold voltage level whose level is determined corresponding to the amplitude of the detected current.

2. The semiconductor device of claim 1, wherein the detected current generating unit controls such that the detected current flows in a detection node connected to the sources by applying a boosted voltage to the gates of the plurality of cell transistors, applying a back bias voltage to the biases, and applying a core voltage to the drains.

3. The semiconductor device of claim 2, wherein the detected voltage generating unit is provided with a fixed resistor which is serially connected between the detection node and a ground voltage end and has a predetermined resistance for generating the detected threshold voltage level in response to the detected current.

4. The semiconductor device of claim 1, wherein the boosted voltage generating unit includes:

a boosted voltage detector for detecting a boosted voltage by changing the target level in response to the detected threshold voltage level; and a boosted voltage output unit for outputting a boosted voltage corresponding to the target level by controlling execution of a charge pumping operation in response to an output signal of the boosted voltage detector.

5. The semiconductor device of claim 4, wherein if the level of the detected threshold voltage level is large, the boosted voltage detector changes the target level to a high level to detect a boosted voltage.

6. The semiconductor device of claim 4, wherein if the level of the detected threshold voltage level is small, the boosted voltage detector changes the target level to a low level to detect a boosted voltage.

7. The semiconductor device of claim 4, wherein the boosted voltage detector includes:

a voltage divider for dividing the boosted voltage at a predetermined ratio, at which the value is determined in response to the level of the detected threshold voltage level, to generate a divided voltage; and a voltage comparator for comparing levels of the divided voltage and a reference voltage to output a boosted voltage detection signal whose logic level is determined based on the result of comparison.

8. The semiconductor device of claim 7, wherein the voltage divider is provided with a first fixed resistor connected in series between a boosted voltage end and a division node and having a predetermined resistance, a variable resistor having a resistance varying depending on the level of the detected threshold voltage level, and a second fixed resistor having a predetermined resistance serially connected between the division node and a ground voltage end, the divided voltage being generated at the division node.

9. The semiconductor device of claim 8, wherein the variable resistor is provided with an NMOS transistor whose gate receives the detected threshold voltage level and for controlling the amount of current flowing between the first fixed resistor and the division node, which are connected to the drain and source, respectively, in response to the level of the detected threshold voltage level.

10. The semiconductor device of claim 7, wherein if the level of the divided voltage is higher than the level of the reference voltage by a predetermined voltage level, the voltage comparator deactivates and outputs the boosted voltage detection signal.

11. The semiconductor device of claim 7, wherein if the level of the divided voltage is lower than the level of the reference voltage by a predetermined voltage level, the voltage comparator activates and outputs the boosted voltage detection signal.

12. The semiconductor device of claim 7, wherein the voltage comparator includes:

a unit amplifier for changing the level of a voltage applied to an output node corresponding to a level difference between the divided voltage and the reference voltage; and a driver for driving the boosted voltage detection signal corresponding to the level of a voltage applied to the output node.

13. The semiconductor device of claim 4, wherein the boosted voltage output unit includes:

an oscillator for outputting an oscillation signal toggling in a predetermined cycle in response to an output signal of the boosted voltage detector; and a pumping unit for rising a level of a boosted voltage by performing a charge pumping operation in response to the oscillation signal.

14. The semiconductor device of claim 13, wherein the cell array includes a test cell array.

15. A driving method of a semiconductor device, comprising:

detecting a threshold voltage level of cell transistors to output a detected threshold voltage level; and changing a target level of a boosted voltage level in response to the detected threshold voltage level, wherein the detecting of the threshold voltage level includes:

changing an amplitude of a detected current flowing in a detection node corresponding to an amplitude of the threshold voltage of each of the cell transistors in a cell array; and outputting the detected threshold voltage level determined corresponding to the amplitude of the detected current.

16. The driving method of claimer 15, wherein the changing of the target level of the boosted voltage level includes:

detecting a level of a boosted voltage by changing the target level in response to the detected threshold voltage level and outputting a detected boosted voltage level; and outputting a boosted voltage corresponding to the target level by controlling the execution of a charge pumping operation in response to the boosted voltage level.

17. The driving method of claim 16, wherein the detecting of the level of the boosted voltage includes:

dividing the boosted voltage at a predetermined ratio, at which the value is determined in response to the level of the detected threshold voltage level, to generate a divided voltage; and comparing levels of the divided voltage and a reference voltage to generate the boosted voltage level based on a comparison result.

18. The driving method of claim 17, wherein the outputting of the boosted voltage includes:

outputting an oscillation signal toggling in a predetermined cycle in response to the boosted voltage detection signal; and rising a level of a boosted voltage by performing a charge pumping operation in response to the oscillation signal.

19. A semiconductor device, comprising:

a test cell array for having cell transistors;

a threshold voltage detector for detecting a threshold voltage level of the cell transistors and outputting a detected threshold voltage level; and a boosted voltage generating unit for changing a target level of a boosted voltage according to the detected threshold voltage level of the cell transistors, wherein the threshold voltage detector includes:

a detected current generating unit having the cell transistors in a cell array and for generating a detected current whose amplitude varies corresponding to an average level of the threshold voltages of the cell transistors; and a detected voltage generating unit for generating the detected threshold voltage level whose level is determined corresponding to the amplitude of the detected current.

20. The semiconductor device of claim 19, wherein the boosted voltage generating unit changes the target level of the boosted voltage in response to the detected threshold voltage level.

* * * * *